US011750214B2

(12) United States Patent
Sloane

(10) Patent No.: US 11,750,214 B2
(45) Date of Patent: *Sep. 5, 2023

(54) SYSTEM FOR ELECTRONIC DATA COMPRESSION BY AUTOMATED TIME-DEPENDENT COMPRESSION ALGORITHM

(71) Applicant: BANK OF AMERICA CORPORATION, Charlotte, NC (US)

(72) Inventor: Brandon Sloane, Indian Land, SC (US)

(73) Assignee: BANK OF AMERICA CORPORATION, Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/102,423

(22) Filed: Jan. 27, 2023

(65) Prior Publication Data

US 2023/0170919 A1  Jun. 1, 2023

Related U.S. Application Data

(63) Continuation of application No. 17/363,478, filed on Jun. 30, 2021, now Pat. No. 11,601,136.

(51) Int. Cl.
G06F 16/17 (2019.01)
H03M 7/30 (2006.01)
G06F 16/174 (2019.01)

(52) U.S. Cl.
CPC ....... *H03M 7/6011* (2013.01); *G06F 16/1744* (2019.01)

(58) Field of Classification Search
CPC .................. H03M 7/6011; G06F 16/1744
USPC ......................................................... 707/693
See application file for complete search history.

(56) References Cited

U.S. PATENT DOCUMENTS

2013/0297575 A1\* 11/2013 Fallon ................. H03M 7/4043
707/693

\* cited by examiner

*Primary Examiner* — Hicham Skhoun
(74) *Attorney, Agent, or Firm* — Moore & Van Allen PLLC; Seongun M. Hong

(57) ABSTRACT

A system is provided for electronic data compression by automated time-dependent compression algorithm. In particular, the system may track instances in which a particular dataset is used, copied, or accessed over time. For certain datasets (e.g., datasets that have not been accessed for a threshold amount of time), the system may use a time-based compression algorithm that progressively removes the least significant bits of such datasets as time passes. The compression of the datasets may continue until the system detects that further compression would cause the dataset to be unreadable or unrecoverable. In this way, the system may minimize the computing resources allocated to storing datasets that are not frequently accessed.

20 Claims, 3 Drawing Sheets

200

```
┌─────────────────────────────────────────────┐
│ IDENTIFY, WITHIN A NETWORK, A DATA SET FOR  │
│              DATA COMPRESSION               │
│                     201                     │
└─────────────────────────────────────────────┘
                      ↓
┌─────────────────────────────────────────────┐
│ DETECT, BASED ON A COUNTDOWN TIMER ASSOCIATED│
│ WITH THE DATA SET, THAT A TIME THRESHOLD FOR │
│         THE DATA SET HAS BEEN REACHED        │
│                     202                     │
└─────────────────────────────────────────────┘
                      ↓
┌─────────────────────────────────────────────┐
│ BASED ON DETECTING THAT THE TIME THRESHOLD   │
│ FOR THE DATA SET HAS BEEN REACHED, EXECUTE A │
│ DATA COMPRESSION PROCESS ON THE DATA SET,    │
│ WHEREIN THE DATA COMPRESSION PROCESS         │
│ COMPRISES REMOVING AT LEAST ONE LEAST        │
│ SIGNIFICANT BIT FROM THE DATA SET            │
│                     203                     │
└─────────────────────────────────────────────┘
                      ↓
┌─────────────────────────────────────────────┐
│ ITERATIVELY EXECUTE THE DATA COMPRESSION     │
│ PROCESS ON THE DATA SET AT A PREDEFINED      │
│ INTERVAL, WHEREIN THE PREDEFINED INTERVAL IS │
│ BASED ON A COMPRESSION RATE ASSOCIATED WITH  │
│ THE DATA SET                                 │
│                     204                     │
└─────────────────────────────────────────────┘
                      ↓
┌─────────────────────────────────────────────┐
│ DETECT THAT FURTHER COMPRESSION OF THE DATA  │
│ SET WOULD CAUSE THE DATA SET TO BE           │
│ UNRECOVERABLE                                │
│                     205                     │
└─────────────────────────────────────────────┘
                      ↓
┌─────────────────────────────────────────────┐
│      FLAG THE DATA SET AS FULLY COMPRESSED   │
│                     206                     │
└─────────────────────────────────────────────┘
```

```
┌─────────────────────────────────────────────────────────┐
│ DETECT THAT A COMPRESSED DATA SET HAS BEEN ACCESSED BY  │
│         A COMPUTING DEVICE WITHIN THE NETWORK           │
│                          301                            │
└─────────────────────────────────────────────────────────┘
                            │
                            ▼
┌─────────────────────────────────────────────────────────┐
│      RESET THE COUNTDOWN TIMER ASSOCIATED WITH THE      │
│                   COMPRESSED DATA SET                   │
│                          302                            │
└─────────────────────────────────────────────────────────┘
                            │
                            ▼
┌─────────────────────────────────────────────────────────┐
│  INITIATE AN INTELLIGENT RECONSTRUCTION PROCESS ON THE  │
│  COMPRESSED DATA SET, THE INTELLIGENT RECONSTRUCTION    │
│  PROCESS COMPRISING USING A FUZZY RECONSTRUCTION        │
│  ALGORITHM TO RESTORE THE AT LEAST ONE LEAST SIGNIFICANT│
│                   BIT OF THE DATA SET                   │
│                          303                            │
└─────────────────────────────────────────────────────────┘
                            │
                            ▼
┌─────────────────────────────────────────────────────────┐
│   PROVISION A RECONSTRUCTED DATA SET TO THE COMPUTING   │
│                         DEVICE                          │
│                          304                            │
└─────────────────────────────────────────────────────────┘
```

FIG. 3

SYSTEM FOR ELECTRONIC DATA COMPRESSION BY AUTOMATED TIME-DEPENDENT COMPRESSION ALGORITHM

CROSS-REFERENCE TO RELATED APPLICATION

The present application is a continuation application of and claims priority to U.S. patent application Ser. No. 17/363,478 filed Jun. 30, 2021 of the same title; the contents of which are also incorporated by reference herein.

FIELD OF THE INVENTION

The present disclosure embraces a system for electronic data compression by automated time-dependent compression algorithm.

BACKGROUND

There is a need for an efficient and effective way to compress electronic data.

BRIEF SUMMARY

The following presents a simplified summary of one or more embodiments of the invention in order to provide a basic understanding of such embodiments. This summary is not an extensive overview of all contemplated embodiments and is intended to neither identify key or critical elements of all embodiments, nor delineate the scope of any or all embodiments. Its sole purpose is to present some concepts of one or more embodiments in a simplified form as a prelude to the more detailed description that is presented later.

A system is provided for electronic data compression by automated time-dependent compression algorithm. In particular, the system may track instances in which a particular dataset is used, copied, or accessed over time. For certain datasets (e.g., datasets that have not been accessed for a threshold amount of time), the system may use a time-based compression algorithm that progressively removes the least significant bits of such datasets as time passes. The compression of the datasets may continue until the system detects that further compression would cause the dataset to be unreadable or unrecoverable. In this way, the system may minimize the computing resources allocated to storing datasets that are not frequently accessed.

Accordingly, embodiments of the present disclosure provide a system for electronic data compression by automated time-dependent compression algorithm, the system comprising a memory device with computer-readable program code stored thereon; a communication device; and a processing device operatively coupled to the memory device and the communication device, wherein the processing device is configured to execute the computer-readable program code to identify, within a network, a data set for compression; detect, based on a countdown timer associated with the data set, that a time threshold for the data set has been reached; based on detecting that the time threshold for the data set has been reached, execute a data compression process on the data set, wherein the data compression process comprises removing at least one least significant bit from the data set; iteratively execute the data compression process on the data set at a predefined interval, wherein the predefined interval is based on a compression rate associated with the data set; detect that further compression of the data set would cause the data set to be unrecoverable; and flag the data set as fully compressed.

In some embodiments, the computer-readable program code, when executed, further causes the processing device to detect that the data set has been accessed by a computing device within the network; reset the countdown timer associated with the data set; initiate an intelligent reconstruction process on the data set, wherein the intelligent reconstruction process comprises generating a reconstructed data set using a fuzzy reconstruction algorithm to restore the at least one least significant bit of the data set; and provision the reconstructed data set to the computing device.

In some embodiments, flagging the data set as fully compressed comprises automatically deleting the data set or queuing the data set for deletion.

In some embodiments, the data compression process comprises dividing the data set into a plurality of subsets, wherein removing the at least one least significant bit from the data set comprises removing a least significant bit from at least one subset from the plurality of sub sets.

In some embodiments, the time threshold is defined by the system based on at least one of data type or data priority.

In some embodiments, restoring the at least one least significant bit of the data set comprises detecting that setting the at least one least significant bit to a first value would result in a corrupted data set; and setting the at least one least significant bit to a second value.

In some embodiments, flagging the data set as fully compressed prevents the data set from further compression.

Embodiments of the present disclosure also provide a computer program product for electronic data compression by automated time-dependent compression algorithm, the computer program product comprising at least one non-transitory computer readable medium having computer-readable program code portions embodied therein, the computer-readable program code portions comprising executable code portions for identifying, within a network, a data set for compression; detecting, based on a countdown timer associated with the data set, that a time threshold for the data set has been reached; based on detecting that the time threshold for the data set has been reached, executing a data compression process on the data set, wherein the data compression process comprises removing at least one least significant bit from the data set; iteratively executing the data compression process on the data set at a predefined interval, wherein the predefined interval is based on a compression rate associated with the data set; detecting that further compression of the data set would cause the data set to be unrecoverable; and flagging the data set as fully compressed.

In some embodiments, the computer-readable program code portions further comprise executable code portions for detecting that the data set has been accessed by a computing device within the network; resetting the countdown timer associated with the data set; initiating an intelligent reconstruction process on the data set, wherein the intelligent reconstruction process comprises generating a reconstructed data set using a fuzzy reconstruction algorithm to restore the at least one least significant bit of the data set; and provisioning the reconstructed data set to the computing device.

In some embodiments, flagging the data set as fully compressed comprises automatically deleting the data set or queuing the data set for deletion.

In some embodiments, the data compression process comprises dividing the data set into a plurality of subsets, wherein removing the at least one least significant bit from the data set comprises removing a least significant bit from at least one subset from the plurality of sub sets.

In some embodiments, the time threshold is defined by the system based on at least one of data type or data priority.

In some embodiments, restoring the at least one least significant bit of the data set comprises detecting that setting the at least one least significant bit to a first value would result in a corrupted data set; and setting the at least one least significant bit to a second value.

Embodiments of the present disclosure also provide a computer-implemented method for electronic data compression by automated time-dependent compression algorithm, wherein the computer-implemented method comprises identifying, within a network, a data set for compression; detecting, based on a countdown timer associated with the data set, that a time threshold for the data set has been reached; based on detecting that the time threshold for the data set has been reached, executing a data compression process on the data set, wherein the data compression process comprises removing at least one least significant bit from the data set; iteratively executing the data compression process on the data set at a predefined interval, wherein the predefined interval is based on a compression rate associated with the data set; detecting that further compression of the data set would cause the data set to be unrecoverable; and flagging the data set as fully compressed.

In some embodiments, the computer-implemented method further comprises detecting that the data set has been accessed by a computing device within the network; resetting the countdown timer associated with the data set; initiating an intelligent reconstruction process on the data set, wherein the intelligent reconstruction process comprises generating a reconstructed data set using a fuzzy reconstruction algorithm to restore the at least one least significant bit of the data set; and provisioning the reconstructed data set to the computing device.

In some embodiments, flagging the data set as fully compressed comprises automatically deleting the data set or queuing the data set for deletion.

In some embodiments, the data compression process comprises dividing the data set into a plurality of subsets, wherein removing the at least one least significant bit from the data set comprises removing a least significant bit from at least one subset from the plurality of sub sets.

In some embodiments, the time threshold is defined by the system based on at least one of data type or data priority.

In some embodiments, restoring the at least one least significant bit of the data set comprises detecting that setting the at least one least significant bit to a first value would result in a corrupted data set; and setting the at least one least significant bit to a second value.

In some embodiments, flagging the data set as fully compressed prevents the data set from further compression.

The features, functions, and advantages that have been discussed may be achieved independently in various embodiments of the present invention or may be combined with yet other embodiments, further details of which can be seen with reference to the following description and drawings.

BRIEF DESCRIPTION OF THE DRAWINGS

Figure 1:
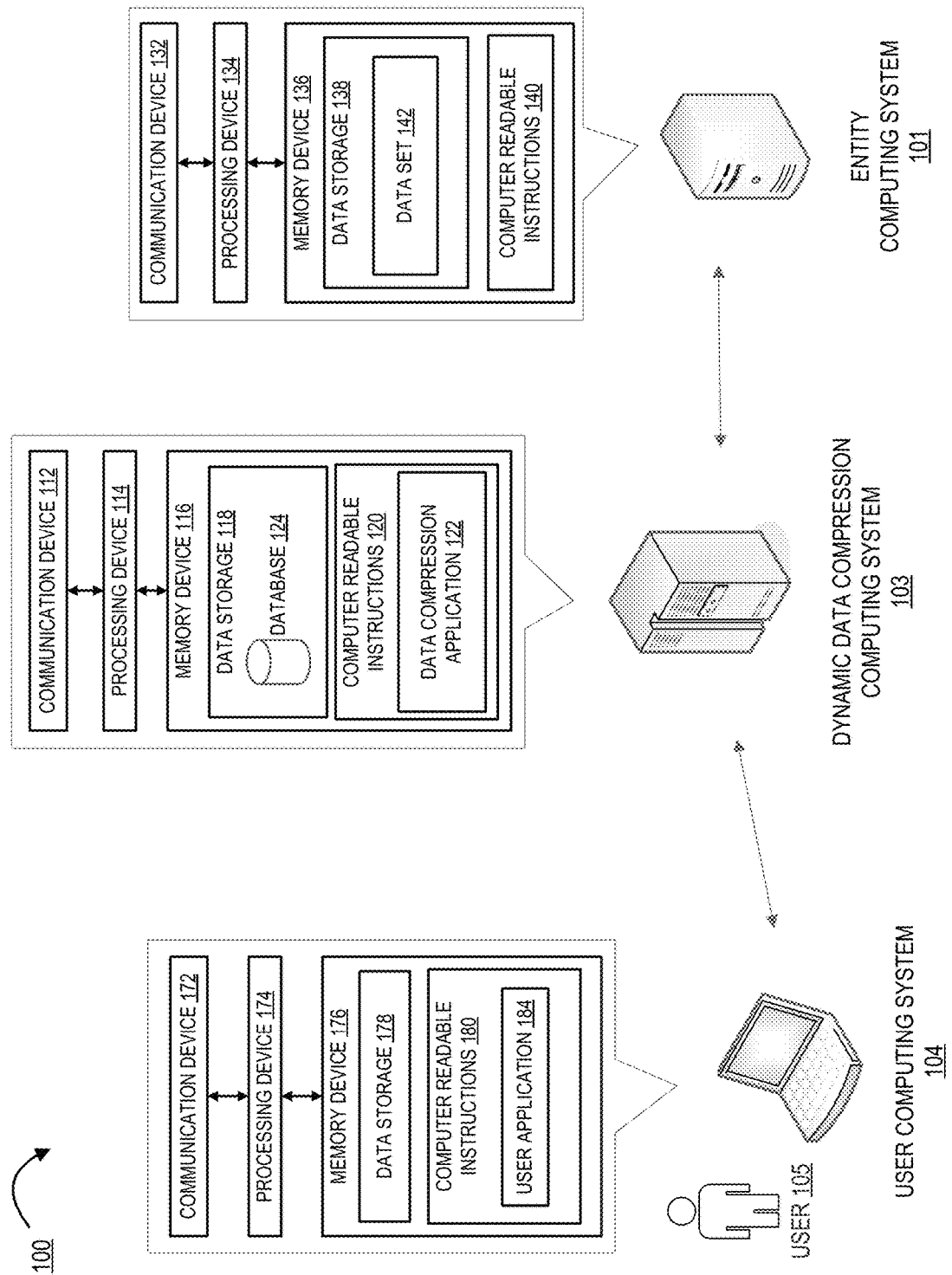

Having thus described embodiments of the invention in general terms, reference will now be made to the accompanying drawings, wherein:

FIG. 1 illustrates an operating environment for the time-dependent data compression system, in accordance with one embodiment of the present disclosure;

FIG. 2 illustrates a process flow for electronic data compression by automated time-dependent compression algorithm, in accordance with one embodiment of the present disclosure; and FIG. 3 illustrates a process flow for performing intelligent reconstruction of a compressed data set, in accordance with one embodiment of the present disclosure.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to elements throughout. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein.

"Entity" as used herein may refer to an individual or an organization that owns and/or operates an online system of networked computing devices, systems, and/or peripheral devices on which the system described herein is implemented. The entity may be a business organization, a non-profit organization, a government organization, and the like, which may routinely use various types of applications within its enterprise environment to accomplish its organizational objectives.

"Entity system" as used herein may refer to the computing systems, devices, software, applications, communications hardware, and/or other resources used by the entity to perform the functions as described herein. Accordingly, the entity system may comprise desktop computers, laptop computers, servers, Internet-of-Things ("IoT") devices, networked terminals, mobile smartphones, smart devices (e.g., smart watches), network connections, and/or other types of computing systems or devices and/or peripherals along with their associated applications.

"Computing system" or "computing device" as used herein may refer to a networked computing device within the entity system. The computing system may include a processor, a non-transitory storage medium, a communications device, and a display. The computing system may be configured to support user logins and inputs from any combination of similar or disparate devices. Accordingly, the computing system may be a portable electronic device such as a smartphone, tablet, single board computer, smart device, or laptop. In other embodiments, the computing system may be a stationary unit such as a personal desktop computer, networked terminal, IoT device, or the like.

"User" as used herein may refer to an individual who may interact with the entity system to access the functions therein. Accordingly, the user may be an agent, employee, associate, contractor, or other authorized party who may access, use, administrate, maintain, and/or manage the computing systems within the entity system. In other embodiments, the user may be a client or customer of the entity.

Accordingly, the term "user device" or "mobile device" may refer to mobile phones, personal computing devices, tablet computers, wearable devices, and/or any stationary or portable electronic device capable of receiving and/or storing data therein.

"Compression algorithm" as used herein may refer to an algorithm that transforms or encodes a dataset into a format may be represented in fewer bits than the original (or "uncompressed") version of the dataset, thereby causing the encoded (or "compressed") dataset to take up a smaller amount of data storage space. In some embodiments, the compression algorithm may be a "lossy" compression algorithm that may remove certain bits within a dataset that may be non-critical to the functioning of the particular dataset. For instance, data relating to certain frequencies within a raw audio data file (e.g., frequencies that are not readily perceived by the human ear) may be removed by a lossy compression algorithm.

"Least significant bit" or "LSB" as used herein may refer to the lowest bit in a data string or data set (e.g., the right-most digit in a binary string). Accordingly, the LSB may be the bit position that has the lowest value in a particular data string or set.

Computing devices and systems within a network environment may be used store various types of data and data sets. That said, some large data sets or files may continue to be stored even if such data sets or files are rarely accessed by users and/or computing devices within the network. In this regard, it may be desirable to compress data sets or large data files based on the usage of such data sets or data files. Accordingly, the system as described herein provides a way to automatically and progressively compress data over time.

The system may continuously monitor data sets stored within the network environment to determine the usage frequency of each of the data sets. To this end, the system may track information such as the date and/or time at which a particular data set was last accessed by a user or system within the network environment and store such information within a data tracking repository. In some embodiments, the system may further store other types of metadata about the monitored data sets. For instance, the system may store information on the relative importance or sensitivity of certain data sets. Furthermore, the system may also store information regarding the types of rules or policies that may apply to certain data sets (e.g., data security policies, data retention policies, or the like).

Based on the metadata associated with each of the data sets, the system may determine a time threshold for each data set, where the time threshold may be measured according to a countdown that begins from the date and time at which the data set was last accessed. Once the time threshold has elapsed for a particular data set, the system may begin to progressively compress the data set. The time threshold may be altered by the system depending on various factors as identified through the metadata related to each data set. For instance, the metadata for a particular data set may identify the data set as having a high "priority" or "importance" value (e.g., the data set may serve an important purpose to an entity even if the data set is rarely accessed). In such embodiments, the time threshold for the data set may be relatively longer (or be infinitely long) such that the data set is compressed slowly over time or, in some embodiments, not compressed at all. In other scenarios, a data set may be subject to a particular policy (e.g., a 10 year data retention policy), which may cause the system to designate a time threshold that is at least 10 years long. In contrast, data sets that are of relatively low importance may be associated with a shorter time threshold such that the systems begin the progressive compression process at a relatively earlier time. In some embodiments, the system may reset the countdown for a particular data set if the data set is accessed by a user or device within the network.

Once the time threshold has been reached for a particular data set, the system may use one or more compression algorithms to perform the data compression of the data set. In some embodiments, the compression algorithm may be a lossy compression algorithm that, over time, removes the least significant bit of a data set at predefined intervals (which may be referred to herein as "compression intervals"). Accordingly, the "compression rate" for a data set may be inversely proportional to the compression intervals (e.g., shorter compression intervals result in a higher compression rate, and longer compression intervals result in a lower compression rate). The compression rate may be set by the system to be higher or lower depending on the factors described above, such as the importance of a data set and/or rules or policies that may apply to the data set. In some embodiments, the data set may first be divided into smaller data segments before applying the LSB operations on one or more of the data segments. In this way, unused data sets may become smaller over time, thereby allowing the system to progressively recover data storage space.

In some embodiments, the progression of compression for a particular data set may be reset if the data set is accessed after the compression process has begun. In such embodiments, the countdown or time threshold for the data set may be reset and a reconstruction process may be executed on the data set. In this regard, the system may use an intelligent fuzzy data reconstruction process that may attempt to round up or down bits that have been dropped during the data compression process based on information such as the data type (e.g., file extension), data context (e.g., the remaining data after compression), other similar data sets, or the like. The reconstruction process may further comprise executing decryption techniques such as a chi-squared calculation or quadgrams to confirm the successful reconstruction of the data.

Exemplary use cases of the system are described below for illustrative purposes only and are not intended to restrict or reduce the scope of the disclosure provided herein. In one embodiment, a database within an entity's network may store a large video data file (e.g., a surveillance video feed from a networked camera). Based on the data type (e.g., identifying the data file as containing video data), rules or policies associated with the data file (e.g., data retention policies for surveillance data), the relative importance of the data (e.g., whether the area under surveillance is a high priority area), and other types of information (e.g., video metadata), the system may set a time threshold for the video data file (e.g., 30 days). Accordingly, a countdown timer may be initiated for the video data file. If the video data file is accessed (e.g., by a user within the network), the countdown timer may be reset.

Once the countdown timer reaches the time threshold (e.g., 30 days), the system may initiate a compression process by which the system uses a compression algorithm that divides the video data file into one or more subsets and removes the LSB of one or more of the subsets over time. The system may run the compression algorithm automatically at certain time intervals (e.g., every 12 hours, every 5 days, or the like). The intervals may be dynamically adjusted by the system to balance the need for a usable data file against the need to save data storage space. In this way, as the video data file continues to be stored without being accessed by a user or system, the video data file may grow progressively smaller in size over time.

In some embodiments, the compression process may continue until the system determines that further compression would result in the data set becoming unrecoverable or inaccessible. For instance, the system may detect that removing another LSB from the video data file would result in a modulus calculation that causes the video data file to become unrecoverable. In such an embodiment, the system may flag the video data file as fully compressed, thereby preventing any more LSB's from being removed from the fully compressed data file. In other embodiments, the system may automatically delete a data set if the system determines that further compression would result in the data set becoming unrecoverable.

Give the above, it should be understood that the possible level of compression may depend on the type of data being compressed. For instance, a video file containing image and audio data may remain usable even if the image and audio data become distorted as a result of the fuzzy reconstruction process. On the other hand, a data file used for file integrity verification purposes (e.g., a data file containing checksum values) or a compressed archive may become unusable if even a single bit is changed. Accordingly, the system may determine the maximum level of compression for a given data set depending on its data type.

If the video data file is accessed after the compression process has begun, the system may attempt to use intelligent fuzzy reconstruction to "guess" whether a particular LSB of the data set (or subset) should be rounded up or down (e.g., a 0 or 1). The reconstruction process may comprise an error checking component that checks whether the rounding performed during reconstruction results in a valid data file. For instance, if rounding down a particular bit results in a video data file that is not readable by a media player whereas rounding up said bit results in a readable video data file, the system may determine that said particular bit should be rounded up.

The video data file may continue to be compressed until the system determines that one more iteration of the compression algorithm would result in a video data file that is unrecoverable (e.g., the video file would become unreadable, unplayable, or distorted to be practically unusable). In some embodiments, the system may add a flag (e.g., to the metadata of the video file) that the video data file has been fully compressed, thereby causing the system to halt the compression process on the fully compressed video data file. In such an embodiment, no further LSB's would be removed from the video data file or any of its subsegments. In other embodiments, the system may automatically delete the video data file if the video data file has been fully compressed and/or one or more rules or policies have been satisfied (e.g., the video data file has been stored for the requisite amount of time as specified by a data retention policy).

The system as described herein confers a number of technological advantages over conventional data compression systems or processes. For instance, by automatically and progressively applying compression algorithms in conjunction with the intelligent data reconstruction processes, the system may dynamically reduce data file sizes over time, thereby saving valuable computing resources such as memory and/or data storage space of the computing devices within the network environment.

Turning now to the figures, FIG. 1 illustrates an operating environment 100 for the time-dependent data compression system, in accordance with one embodiment of the present disclosure. In particular, FIG. 1 illustrates a dynamic data compression computing system 103 that is operatively coupled, via a network, to an entity computing system 101 and/or a user computing system 104. In such a configuration, the dynamic data compression computing system 103 may transmit information to and/or receive information from the entity computing system 101 and/or the user computing system 104.

It should be understood by one skilled in the art that FIG. 1 illustrates only an exemplary embodiment of the operating environment 100, and it will be appreciated that the operating environment 100 may comprise a fewer or greater number of computing systems and/or devices than are depicted in FIG. 1. For example, though FIG. 1 depicts the entity computing system 101 and user computing system 104 as singular computing systems, some embodiments may include a greater number of entity computing systems and user computing systems within the network environment. It should also be understood that one or more functions of the systems, devices, or servers as depicted in FIG. 1 may be combined into a single system, device, or server. For instance, in some embodiments, the functions of the entity computing system 101 may be performed by the dynamic data compression computing system 103, or conversely, the functions of the dynamic data compression computing system 103 may be performed by the entity computing system 101. Furthermore, a single system, device, or server as depicted in FIG. 1 may represent multiple systems, devices, or servers. For instance, though the dynamic data compression computing system 103 is depicted as a single unit, the functions of the dynamic data compression computing system 103 may be distributed across multiple computing systems.

The network may be a system specific distributive network receiving and distributing specific network feeds and identifying specific network associated triggers. The network may include one or more cellular radio towers, antennae, cell sites, base stations, telephone networks, cloud networks, radio access networks (RAN), Wi-Fi networks, or the like. Additionally, the network may also include a global area network (GAN), such as the Internet, a wide area network (WAN), a local area network (LAN), or any other type of network or combination of networks. Accordingly, the network may provide for wireline, wireless, or a combination wireline and wireless communication between devices on the network.

As illustrated in FIG. 1, the dynamic data compression computing system 103 may be a networked server, desktop computer, laptop computer, routing device, or other type of computing system within the network environment which performs the time-based data compression processes as described herein. Accordingly, the dynamic data compression computing system 103 may comprise a processing device 114 operatively coupled to a communication device 112 and a memory device 116 having data storage 118 and computer readable instructions 120 stored thereon.

As used herein, the term "processing device" generally includes circuitry used for implementing the communication and/or logic functions of the particular system. For example, a processing device may include a digital signal processor device, a microprocessor device, and various analog-to-digital converters, digital-to-analog converters, and other support circuits and/or combinations of the foregoing. Control and signal processing functions of the system are allocated between these processing devices according to their respective capabilities. The processing device may include functionality to operate one or more software programs based on computer-readable instructions thereof, which may be stored in a memory device.

The processing device 114 may use the communication device 112 to communicate with the network and other devices on the network, such as, but not limited to the entity computing system 101 and/or the user computing system 104. Accordingly, the communication device 112 generally comprises one or more hardware components such as a modem, antennae, Wi-Fi or Ethernet adapter, radio transceiver, or other device for communicating with other devices on the network.

In some embodiments, the memory device 116 includes data storage 118 for storing data related to the system environment. In this regard, the data storage 118 may comprise a database 124, which may be used to store information needed to perform the processes of the dynamic data compression computing system 103. For instance, the database 124 may comprise information about the various types of data sets stored within the network environment that may be subjected to the data compression processes of the dynamic data compression computing system 103. In this regard, the database 124 may comprise metadata regarding the data sets, such as the date and/or time at which the data set was last accessed, the time thresholds and/or countdown timers associated with the data set, the data type, data priority (e.g., the relative "importance" of the data to the entity), or the like. In other embodiments, the data compression processes may be performed in a decentralized manner in which each computing device within the network environment performs the data compression processes described herein. In such embodiments, such metadata may be stored locally on the same computing device that stores each data set.

The memory device 116 may further have computer-readable instructions 120 stored thereon, where the computer-readable instructions 120 may comprise a data compression application 122, which may comprise computer-executable program code which may instruct the processing device 114 to perform certain logic, data processing, and data storing functions of the application to accomplish the entity's objectives. For instance, the data compression application 122 may perform time-based compression on the data sets within the network environment (e.g., by dividing data sets into subsegments and progressively removing LSB's of one or more of the subsegments).

As further illustrated in FIG. 1, the operating environment 100 may further comprise an entity computing system 101 in operative communication with the dynamic data compression computing system 103. In particular, the entity computing system 101 may be a computing system identified within the network environment that may contain a data set to be compressed using the compression algorithms described herein. Accordingly, the entity computing system 101 may be a computing system such as a server or networked terminal, though it is within the scope of the disclosure for the entity computing system 101 to be a device such as a desktop computer, laptop, IoT device, smartphone, tablet, single-board computer, or the like.

The entity computing system 101 may comprise a processing device 134 operatively coupled to a communication device 132 and a memory device 136 having data storage 138 and computer readable instructions 140 stored thereon. The data storage 138 may comprise a data set 142 that may be tracked by the dynamic data compression computing system 103 and/or compressed using the time-based compression processes described herein. To this end, the dynamic data compression computing system 103 and/or the entity computing system 101 may track the last-accessed date and/or time of the data set 142 and set a time threshold and countdown timer for the data set 142. Once the time threshold is reached (e.g., the countdown timer has reached 0), the dynamic data compression computing system 103 may begin compressing the data set 142 by removing LSB's from the data set 142.

In some embodiments, the operating environment 100 may further comprise a user computing system 104. The user computing system 104 may be a computing system that may be operated by a user 105, such as an administrator, agent, or employee of the entity. In some embodiments, the user computing system 104 may access data sets stored within the network environment, such as the data set 142 stored within the entity computing system 101. Accordingly, the user computing system 104 may be a computing system such as a desktop computer, laptop computer, smartphone or smart device, tablet, single board computer, or the like, though it is within the scope of the disclosure for the user computing system 104 to be any other kind of computing system as described herein. The user computing system 104 may comprise a user interface comprising one or more input devices (e.g., a keyboard, keypad, microphone, mouse, tracking device, biometric readers, capacitive sensors, or the like) and/or output devices (e.g., a display such as a monitor, projector, headset, touchscreen, and/or auditory output devices such as speakers, headphones, or the like) for interacting with the user 105.

The user computing system 104 may comprise a processing device 174 operatively coupled to a communication device 172 and a memory device 176, the memory device 176 comprising data storage 178 and computer readable instructions 180. The computer readable instructions 180 may comprise a user application 184 that allows the user 105 to take certain actions within the entity network (e.g., accessing e-mails, downloading files, accessing databases, or the like).

The communication devices as described herein may comprise a wireless local area network (WLAN) such as Wi-Fi based on the Institute of Electrical and Electronics Engineers' (IEEE) 802.11 standards, Bluetooth short-wavelength UHF radio waves in the ISM band from 2.4 to 2.485 GHz or other wireless access technology. Alternatively or in addition to the wireless interface, the computing systems may also include a communication interface device that may be connected by a hardwire connection to the resource distribution device. The interface device may comprise a connector such as a USB, SATA, PATA, SAS or other data connector for transmitting data to and from the respective computing system.

The computing systems described herein may each further include a processing device communicably coupled to devices as a memory device, output devices, input devices, a network interface, a power source, a clock or other timer, a camera, a positioning system device, a gyroscopic device, one or more chips, and the like.

In some embodiments, the computing systems may access one or more databases or datastores (not shown) to search for and/or retrieve information related to the service provided by the entity. The computing systems may also access a memory and/or datastore local to the various computing systems within the operating environment 100.

The processing devices as described herein may include functionality to operate one or more software programs or applications, which may be stored in the memory device. For example, a processing device may be capable of operating a connectivity program, such as a web browser application. In this way, the computing systems may transmit and receive web content, such as, for example, product valuation, service agreements, location-based content, and/or other web page content, according to a Wireless Application Protocol (WAP), Hypertext Transfer Protocol (HTTP), and/or the like.

A processing device may also be capable of operating applications. The applications may be downloaded from a server and stored in the memory device of the computing systems. Alternatively, the applications may be pre-installed and stored in a memory in a chip.

The chip may include the necessary circuitry to provide integration within the devices depicted herein. Generally, the chip will include data storage which may include data associated with the service that the computing systems may be communicably associated therewith. The chip and/or data storage may be an integrated circuit, a microprocessor, a system-on-a-chip, a microcontroller, or the like. In this way, the chip may include data storage. Of note, it will be apparent to those skilled in the art that the chip functionality may be incorporated within other elements in the devices. For instance, the functionality of the chip may be incorporated within the memory device and/or the processing device. In a particular embodiment, the functionality of the chip is incorporated in an element within the devices. Still further, the chip functionality may be included in a removable storage device such as an SD card or the like.

A processing device may be configured to use the network interface to communicate with one or more other devices on a network. In this regard, the network interface may include an antenna operatively coupled to a transmitter and a receiver (together a "transceiver"). The processing device may be configured to provide signals to and receive signals from the transmitter and receiver, respectively. The signals may include signaling information in accordance with the air interface standard of the applicable cellular system of the wireless telephone network that may be part of the network. In this regard, the computing systems may be configured to operate with one or more air interface standards, communication protocols, modulation types, and access types. By way of illustration, the devices may be configured to operate in accordance with any of a number of first, second, third, fourth, and/or fifth-generation communication protocols and/or the like. For example, the computing systems may be configured to operate in accordance with second-generation (2G) wireless communication protocols IS-136 (time division multiple access (TDMA)), GSM (global system for mobile communication), and/or IS-95 (code division multiple access (CDMA)), or with third-generation (3G) wireless communication protocols, such as Universal Mobile Telecommunications System (UMTS), CDMA2000, wideband CDMA (WCDMA) and/or time division-synchronous CDMA (TD-SCDMA), with fourth-generation (4G) wireless communication protocols, with fifth-generation (5G) wireless communication protocols, or the like. The devices may also be configured to operate in accordance with non-cellular communication mechanisms, such as via a wireless local area network (WLAN) or other communication/data networks.

The network interface may also include an application interface in order to allow a user or service provider to execute some or all of the above-described processes. The application interface may have access to the hardware, e.g., the transceiver, and software previously described with respect to the network interface. Furthermore, the application interface may have the ability to connect to and communicate with an external data storage on a separate system within the network.

The devices may have an interface that includes user output devices and/or input devices. The output devices may include a display (e.g., a liquid crystal display (LCD) or the like) and a speaker or other audio device, which are operatively coupled to the processing device. The input devices, which may allow the devices to receive data from a user, may include any of a number of devices allowing the devices to receive data from a user, such as a keypad, keyboard, touch-screen, touchpad, microphone, mouse, joystick, other pointer device, button, soft key, and/or other input device(s).

The devices may further include a power source. Generally, the power source is a device that supplies electrical energy to an electrical load. In some embodiment, power source may convert a form of energy such as solar energy, chemical energy, mechanical energy, or the like to electrical energy. Generally, the power source may be a battery, such as a lithium battery, a nickel-metal hydride battery, or the like, that is used for powering various circuits, e.g., the transceiver circuit, and other devices that are used to operate the devices. Alternatively, the power source may be a power adapter that can connect a power supply from a power outlet to the devices. In such embodiments, a power adapter may be classified as a power source "in" the devices.

As described above, the computing devices as shown in FIG. 1 may also include a memory device operatively coupled to the processing device. As used herein, "memory" may include any computer readable medium configured to store data, code, or other information. The memory device may include volatile memory, such as volatile Random-Access Memory (RAM) including a cache area for the temporary storage of data. The memory device may also include non-volatile memory, which can be embedded and/or may be removable. The non-volatile memory may additionally or alternatively include an electrically erasable programmable read-only memory (EEPROM), flash memory or the like.

The memory device may store any of a number of applications or programs which comprise computer-executable instructions/code executed by the processing device to implement the functions of the devices described herein.

The computing systems may further comprise a gyroscopic device. The positioning system, input device, and the gyroscopic device may be used in correlation to identify phases within a service term.

Each computing system may also have a control system for controlling the physical operation of the device. The control system may comprise one or more sensors for detecting operating conditions of the various mechanical and electrical systems that comprise the computing systems or of the environment in which the computing systems are used. The sensors may communicate with the processing device to provide feedback to the operating systems of the device. The control system may also comprise metering devices for measuring performance characteristics of the computing systems. The control system may also comprise controllers such as programmable logic controllers (PLC), proportional integral derivative controllers (PID) or other machine controllers. The computing systems may also comprise various electrical, mechanical, hydraulic or other systems that perform various functions of the computing systems. These systems may comprise, for example, electrical circuits, motors, compressors, or any system that enables functioning of the computing systems.

FIG. 2 illustrates a process flow 200 for electronic data compression by automated time-dependent compression algorithm, in accordance with one embodiment of the present disclosure. The process begins at block 201, where the system identifies, within a network, a data set for data compression. In this regard, computing devices within an entity network environment may store data sets that are unused or seldom accessed over time. Accordingly, the system may progressively compress the unused data sets over time such that the data sets do not occupy device storage space in excess of what is necessary to the entity.

In some embodiments, the system may analyze data sets within the network environment according to the properties of such data sets to determine whether the data sets should be compressed, and if so, at what rate the data sets should be compressed. Accordingly, the system may analyze metadata associated with the data sets, where such metadata may include the data file type, the priority or importance of the data set, rules or policies associated with the data set, and the like. For instance, certain types of data file types (e.g., image or audio data files) may be more readily compressible than others (e.g., ZIP archives). In such scenarios, the more readily compressible data types may be compressed to a greater degree by the compression algorithms over time. In other cases, certain types of data may be assigned a higher priority than others. For instance, it may be important to an entity that a critical data file containing private user data is maintained in an optimally usable state. Accordingly, important data files may be compressed to a lesser extent than others, or in some embodiments, such data files may be identified by the system as data files that should not be compressed at all.

The process continues to block 202, where the system detects, based on a countdown timer associated with the data set, that a time threshold for the data set has been reached. The countdown timer may be set by the system depending on the metadata associated with the data set using the same criteria described above. For instance, more readily compressible data types, such as video files, may be associated with a relatively shorter countdown timer, as a video file remains usable and/or suitable for purpose even if compressed. Accordingly, the time threshold, which is dependent on the countdown timer, may indicate the time that must elapse before the data compression process is initiated for a particular data set. In an exemplary embodiment, the time threshold for a particular data set (e.g., a document file) may be 30 days. In such an embodiment, a countdown timer may be initiated starting from the date and time at which the document file was last accessed, where the countdown timer counts down from the value of the time threshold (e.g., 30 days).

The process continues to block 203, where the system, based on detecting that the time threshold for the data set has been reached, executes a data compression process on the data set, wherein the data compression process comprises removing at least one least significant bit from the data set. Continuing the above example, the system may detect that 30 days (the time threshold for the document file) has elapsed since the document file has been accessed by a user or computing device. Subsequently, the system may initiate the data compression process on the document file. In some embodiments, the data compression process may comprise dividing the document file into one or more subsegments. The system may then remove an LSB from at least one of the one or more subsegments, thereby reducing the file size of the document file as a whole.

The process continues to block 204, where the system iteratively executes the data compression process on the data set at a predefined interval, wherein the predefined interval is based on a compression rate associated with the data set. As the data set continues to remain stored without being accessed, the system may progressively reduce the file size of said data set over time. Continuing the example, the document file may continue to be stored without being accessed by any of the users in the network. In such an embodiment, the system may associate a compression rate with the document file in the manner described above. Higher compression rates cause the predefined interval between compression runs to be shorter, while lower compression rates cause the predefined interval to be longer. Upon detecting that an interval has elapsed since the last time the document was compressed, the system may once again execute a run of the compression algorithm to remove at least another LSB from the document file. This process may continue as time progresses such that the document file becomes smaller and smaller over time.

The process continues to block 205, where the system detects that further compression of the data set would cause the data set to be unrecoverable. In this regard, the system may continue the iterative compression process until the system detects (e.g., through a modulus calculation) that removing another LSB from the data set would cause the subsequent reconstruction of the data set to fail. Reconstruction of the data set may fail, for instance, if further compression would cause the file to become unreadable or corrupted beyond usability (e.g., the file can no longer be opened by a computing device). In other embodiments, the system may consider the reconstruction a failure if the data file becomes distorted to the point that the data file no longer fulfills its purpose. For instance, an image (e.g., a scan of a user's identifying document) may reach a point at which further compression would introduce data artifacts to the image that would render the image illegible. In such cases, the system may comprise an artificial intelligence powered machine learning module that may be trained to recognize the threshold at which further compression would render the file unusable.

The process continues to block 206, where the system flags the data set as fully compressed. The flag may be stored, for instance, in a repository containing information about data sets that have been compressed by the system. Once the data set has been flagged as being fully compressed, the system may automatically prevent subsequent compression processes from being executed on the data set (e.g., by freezing the countdown timer associated with the data set). In some embodiments, upon flagging a data set as fully compressed, the system may automatically delete the data set or queue the data set to be deleted at a later time (e.g., to satisfy data retention requirements). In this way, the system may automatically ensure that data sets take up no more space than needed.

FIG. 3 illustrates a process flow 300 for performing intelligent reconstruction of a compressed data set, in accordance with one embodiment of the present disclosure. The process begins at block 301, where the system detects that a compressed data set has been accessed by a computing device within the network. In this regard, the compressed data set may be a data file that is being accessed and/or opened for viewing and/or editing. Continuing the above example, the compressed document file may be accessed by a user on a user computing device.

The process continues to block 302, where the system resets the countdown timer associated with the compressed data set. Because the countdown timer starts from the last date and time at which the data set was accessed, opening the data set will cause the "last accessed" date and time to reset, which will then cause the countdown timer to be restored to the original time threshold value (e.g., 30 days).

The process continues to block 303, where the system initiates an intelligent reconstruction process on the compressed data set, the intelligent reconstruction process comprising using a fuzzy reconstruction algorithm to restore the at least one least significant bit of the data set. To this end, the fuzzy reconstruction algorithm may attempt to restore the LSB's of the data set by "guessing" the values of the removed LSB's (e.g., whether the removed LSB's should have been a 0 or 1) to generate a reconstructed data set. For example, if setting the value of the removed LSB to a first value (e.g., 0) would result in a corrupt or incorrect data file, the fuzzy reconstruction algorithm may instead set the value of the removed LSB to a second value (e.g., 1). In some embodiments, such as cases in which the data set in question is an image or audio file, the system may use the AI-powered machine learning module to determine the value of the removed LSB that produces a reconstructed data set that is most likely to be the original data set (e.g., select the values for removed LSB's such that the image file appears visually to be as close to the original as possible). In such embodiments, the machine learning module may be trained using historical image data such that the machine learning module may detect when an image appears to be "correct" or "original" versus when an image appears to be "distorted" or "corrupted."

The process concludes at block 304, where the system provisions the reconstructed data set to the computing device. Once the data set has been reconstructed using the fuzzy reconstruction algorithm, the system may grant access to the data set. In some embodiments, the reconstructed data set may be stored on the system and compressed in the manner described above once the time threshold has been reached again. In this way, the system may minimize data storage requirements for data according to how often such data is accessed.

Each communication interface described herein generally includes hardware, and, in some instances, software, that enables the computer system, to transport, send, receive, and/or otherwise communicate information to and/or from the communication interface of one or more other systems on the network. For example, the communication interface of the user input system may include a wireless transceiver, modem, server, electrical connection, and/or other electronic device that operatively connects the user input system to another system. The wireless transceiver may include a radio circuit to enable wireless transmission and reception of information.

As will be appreciated by one of ordinary skill in the art, the present invention may be embodied as an apparatus (including, for example, a system, a machine, a device, a computer program product, and/or the like), as a method (including, for example, a business process, a computer-implemented process, and/or the like), or as any combination of the foregoing. Accordingly, embodiments of the present invention may take the form of an entirely software embodiment (including firmware, resident software, microcode, and the like), an entirely hardware embodiment, or an embodiment combining software and hardware aspects that may generally be referred to herein as a "system." Furthermore, embodiments of the present invention may take the form of a computer program product that includes a computer-readable storage medium having computer-executable program code portions stored therein.

As the phrase is used herein, a processor may be "configured to" perform a certain function in a variety of ways, including, for example, by having one or more general-purpose circuits perform the function by executing particular computer-executable program code embodied in computer-readable medium, and/or by having one or more application-specific circuits perform the function.

It will be understood that any suitable computer-readable medium may be utilized. The computer-readable medium may include, but is not limited to, a non-transitory computer-readable medium, such as a tangible electronic, magnetic, optical, infrared, electromagnetic, and/or semiconductor system, apparatus, and/or device. For example, in some embodiments, the non-transitory computer-readable medium includes a tangible medium such as a portable computer diskette, a hard disk, a random access memory (RAM), a read-only memory (ROM), an erasable programmable read-only memory (EEPROM or Flash memory), a compact disc read-only memory (CD-ROM), and/or some other tangible optical and/or magnetic storage device. In other embodiments of the present invention, however, the computer-readable medium may be transitory, such as a propagation signal including computer-executable program code portions embodied therein.

It will also be understood that one or more computer-executable program code portions for carrying out the specialized operations of the present invention may be required on the specialized computer include object-oriented, scripted, and/or unscripted programming languages, such as, for example, Java, Perl, Smalltalk, C++, SAS, SQL, Python, Objective C, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F #.

Embodiments of the present invention are described above with reference to flowcharts and/or block diagrams. It will be understood that steps of the processes described herein may be performed in orders different than those illustrated in the flowcharts. In other words, the processes represented by the blocks of a flowchart may, in some embodiments, be in performed in an order other that the order illustrated, may be combined or divided, or may be performed simultaneously. It will also be understood that the blocks of the block diagrams illustrated, in some embodiments, merely conceptual delineations between systems and one or more of the systems illustrated by a block in the block diagrams may be combined or share hardware and/or software with another one or more of the systems illustrated by a block in the block diagrams. Likewise, a device, system, apparatus, and/or the like may be made up of one or more devices, systems, apparatuses, and/or the like. For example, where a processor is illustrated or described herein, the processor may be made up of a plurality of microprocessors or other processing devices which may or may not be coupled to one another. Likewise, where a memory is illustrated or described herein, the memory may be made up of a plurality of memory devices which may or may not be coupled to one another.

It will also be understood that the one or more computer-executable program code portions may be stored in a transitory or non-transitory computer-readable medium (e.g., a memory, and the like) that can direct a computer and/or other programmable data processing apparatus to function in a particular manner, such that the computer-executable program code portions stored in the computer-readable medium produce an article of manufacture, including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with operator and/or human-implemented steps in order to carry out an embodiment of the present invention.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described embodiments can be configured without departing from the scope and spirit of the invention. Therefore, it is to be understood that, within the scope of the appended claims, the invention may be practiced other than as specifically described herein.

What is claimed is:

1. A system for electronic data compression by automated time-dependent compression algorithm, the system comprising:
    a communication device;
    at least one processing device; and
    at least one non-transitory storage device with computer-readable program code stored thereon and accessible by the at least one processing device, wherein the computer-readable code when executed is configured to cause the at least one processing device to:
        identify, within a network, a data set;
        detect, based on a countdown timer associated with the data set, that a time threshold for the data set has been reached;
        based on detecting that the time threshold for the data set has been reached, execute a data compression process on the data set, wherein the data compression process comprises removing at least one least significant bit from the data set;
        iteratively execute the data compression process on the data set at a predefined interval, wherein the predefined interval is based on a compression rate associated with the data set;
        detect that further compression of the data set would cause the data set to be unrecoverable;
        determine that the data set is fully compressed;
        detect that the data set has been accessed by a computing device within the network;
        initiate an intelligent reconstruction process on the data set, wherein the intelligent reconstruction process comprises generating a reconstructed data set using a fuzzy reconstruction algorithm to restore the at least one least significant bit of the data set; and
        provision the reconstructed data set to the computing device.

2. The system according to claim 1, wherein the non-transitory computer-readable medium further comprises code configured to cause the at least one processing device to, after detecting that the data set has been accessed by a computing device within the network, resetting the countdown timer associated with the data set.

3. The system according to claim 1, wherein the non-transitory computer-readable medium further comprises code configured to cause the at least one processing device to flag the data set as fully compressed and delete the data set or queue the data set for deletion.

4. The system according to claim 1, wherein the data compression process comprises dividing the data set into a plurality of subsets, wherein removing the at least one least significant bit from the data set comprises removing a least significant bit from at least one subset from the plurality of subsets.

5. The system according to claim 1, wherein the time threshold is defined based on at least one of data type or data priority.

6. The system according to claim 1, wherein restoring the at least one least significant bit of the data set comprises:
    detecting that setting the at least one least significant bit to a first value would result in a corrupted data set; and
    setting the at least one least significant bit to a second value.

7. The system according to claim 3, wherein flagging the data set as fully compressed prevents the data set from further compression.

8. A computer program product for electronic data compression by automated time-dependent compression algorithm, the computer program product comprising at least one non-transitory computer readable medium having computer-readable program code portions embodied therein, the computer-readable program code portions comprising executable code portions for:
    identifying, within a network, a data set;
    detecting, based on a countdown timer associated with the data set, that a time threshold for the data set has been reached;
    based on detecting that the time threshold for the data set has been reached, executing a data compression process on the data set, wherein the data compression process comprises removing at least one least significant bit from the data set;
    iteratively executing the data compression process on the data set at a predefined interval, wherein the predefined interval is based on a compression rate associated with the data set;
    detecting that further compression of the data set would cause the data set to be unrecoverable;
    determining that the data set is fully compressed;
    detecting that the data set has been accessed by a computing device within the network;
    initiating an intelligent reconstruction process on the data set, wherein the intelligent reconstruction process comprises generating a reconstructed data set using a fuzzy reconstruction algorithm to restore the at least one least significant bit of the data set; and provisioning the reconstructed data set to the computing device.

9. The computer program product according to claim 8, wherein the computer-readable program code portions comprise executable code portions for, after detecting that the data set has been accessed by a computing device within the network, resetting the countdown timer associated with the data set.

10. The computer program product according to claim 8, wherein the computer-readable program code portions comprise executable code portions for flagging the data set as fully compressed and automatically deleting the data set or queuing the data set for deletion.

11. The computer program product according to claim 8, wherein the data compression process comprises dividing the data set into a plurality of subsets, wherein removing the at least one least significant bit from the data set comprises removing a least significant bit from at least one subset from the plurality of subsets.

12. The computer program product according to claim 8, wherein the time threshold is defined based on at least one of data type or data priority.

13. The computer program product according to claim 8, wherein restoring the at least one least significant bit of the data set comprises:
  detecting that setting the at least one least significant bit to a first value would result in a corrupted data set; and
  setting the at least one least significant bit to a second value.

14. A computer-implemented method for electronic data compression by automated time-dependent compression algorithm, wherein the computer-implemented method comprises:
  identifying, within a network, a data set;
  detecting, based on a countdown timer associated with the data set, that a time threshold for the data set has been reached;
  based on detecting that the time threshold for the data set has been reached, executing a data compression process on the data set, wherein the data compression process comprises removing at least one least significant bit from the data set;
  iteratively executing the data compression process on the data set at a predefined interval, wherein the predefined interval is based on a compression rate associated with the data set;
  detecting that further compression of the data set would cause the data set to be unrecoverable;
  determining that the data set is fully compressed;
  detecting that the data set has been accessed by a computing device within the network;
  initiating an intelligent reconstruction process on the data set, wherein the intelligent reconstruction process comprises generating a reconstructed data set using a fuzzy reconstruction algorithm to restore the at least one least significant bit of the data set; and
  provisioning the reconstructed data set to the computing device.

15. The computer-implemented method according to claim 14, further comprises, after detecting that the data set has been accessed by a computing device within the network, resetting the countdown timer associated with the data set.

16. The computer-implemented method according to claim 14 further comprising flagging the data set as fully compressed and deleting the data set or queuing the data set for deletion.

17. The computer-implemented method according to claim 14, wherein the data compression process comprises dividing the data set into a plurality of subsets, wherein removing the at least one least significant bit from the data set comprises removing a least significant bit from at least one subset from the plurality of subsets.

18. The computer-implemented method according to claim 14, wherein the time threshold is defined based on at least one of data type or data priority.

19. The computer-implemented method according to claim 14, wherein restoring the at least one least significant bit of the data set comprises:
  detecting that setting the at least one least significant bit to a first value would result in a corrupted data set; and
  setting the at least one least significant bit to a second value.

20. The computer-implemented method according to claim 16, wherein flagging the data set as fully compressed prevents the data set from further compression.

* * * * *